(12) United States Patent
Izuha

(10) Patent No.: US 8,381,160 B2
(45) Date of Patent: *Feb. 19, 2013

(54) MANUFACTURING METHOD, MANUFACTURING PROGRAM AND MANUFACTURING SYSTEM FOR SEMICONDUCTOR DEVICE

(75) Inventor: Kyoko Izuha, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/288,247

(22) Filed: Nov. 3, 2011

(65) Prior Publication Data
US 2012/0054705 A1 Mar. 1, 2012

Related U.S. Application Data

(63) Continuation of application No. 12/355,216, filed on Jan. 16, 2009, now Pat. No. 8,185,856.

(30) Foreign Application Priority Data

Jan. 24, 2008 (JP) ................................. 2008-013494

(51) Int. Cl.
*G06F 17/50* (2006.01)
(52) U.S. Cl. ............... 716/114; 716/50; 716/51; 716/52; 716/53; 716/54; 716/55; 716/108; 716/113; 716/115; 716/118; 716/119; 716/132; 716/134; 716/139
(58) Field of Classification Search ............... 716/50–55, 716/108, 113–115, 118–119, 132, 134, 139
See application file for complete search history.

(56) References Cited

U.S. PATENT DOCUMENTS

| 5,838,581 | A  | * | 11/1998 | Kuroda ......................... 716/114 |
| 6,009,248 | A  | * | 12/1999 | Sato et al. ..................... 716/114 |
| 6,009,253 | A  | * | 12/1999 | Srivatsa et al. ................ 327/285 |
| 6,539,529 | B2 | * | 3/2003  | Ebisawa et al. ............... 716/114 |
| 6,836,875 | B2 | * | 12/2004 | Porterfield .................... 716/104 |
| 7,069,527 | B1 | * | 6/2006  | Leonhardt ..................... 716/115 |
| 7,784,020 | B2 |   | 8/2010  | Izuha et al. |
| 2002/0068989 | A1 | | 6/2002  | Ebisawa et al. |
| 2006/0271907 | A1 | | 11/2006 | Izuha et al. |

FOREIGN PATENT DOCUMENTS

| JP | 11-040785    |   | 2/1999  |
| JP | 2001-265843  |   | 9/2001  |
| JP | 2003-007828  | A | 1/2003  |
| JP | 2003-133211  |   | 5/2003  |
| JP | 2004-279997  | A | 10/2004 |
| JP | 2006-126745  |   | 5/2006  |
| JP | 2006-318978  | A | 11/2006 |

* cited by examiner

*Primary Examiner* — Nghia Doan
(74) *Attorney, Agent, or Firm* — SNR Denton US LLP

(57) ABSTRACT

A method of manufacturing a semiconductor device, including the steps of: acquiring information on a graphic composing a physical layout of a semiconductor integrated circuit; carrying out calculation for a transferred image in the physical layout; carrying out calculation for a signal delay based on the physical layout, and obtaining a wiring not meeting a specification having the signal delay previously set therein; and setting a portion into which a repeater is to be inserted based on at least one result of results obtained from the information on the graphic and calculation for the transferred image, respectively, with respect to the wiring not meeting the specification.

6 Claims, 8 Drawing Sheets

MANUFACTURING METHOD, MANUFACTURING PROGRAM AND MANUFACTURING SYSTEM FOR SEMICONDUCTOR DEVICE

RELATED APPLICATION DATA

This application is a continuation of U.S. patent application Ser. No. 12/355,216, filed Jan. 16, 2009, the entirety of which is incorporated herein by reference to the extent permitted by law. The present application claims priority to Japanese Patent JP 2008-013494 filed in the Japan Patent Office on Jan. 24, 2008, the entirety of which also is incorporated by reference herein to the extent permitted by law.

BACKGROUND OF THE INVENTION

The present invention relates to a semiconductor device manufacturing method, a semiconductor device manufacturing program, and a semiconductor device manufacturing system each having a pattern design for inserting a repeater for adjusting a signal delay into a wiring(s) of a semiconductor integrated circuit.

In recent years, physical layouts of integrated circuits have been complicated along with miniaturization of semiconductor devices. Processing for generating mask data from the physical layout starts with a layout data on which is outputted after completion of arrangement wiring (a layout based on graphic data). That is to say, optical proximity correction (OPC) processing is executed for a pattern after design rule checking (DRC) processing and schematic inspecting (LVS) processing are carried out for a layout data on which is outputted after completion of the arrangement wiring processing. Also, mask data is generated after completion of the OPC verifying processing.

On the other hand, so-called timing convergence processing, such as RC extracting processing, delay calculating processing, and static timing analyzing (STA) processing, for calculating a parasitic capacitance value and a parasitic resistance value in a semiconductor integrated circuit is executed in parallel with such layout processing.

Recently, a mutual influence between the layout processing side and the timing convergence side has begun to be feared due to the complication of the physical layout described above. For example, when the layout after completion of the detailed wiring is changed, it is necessary to ensure the influence exerted on the timing. Also, in the processing for the timing convergence, it is necessary to confirm whether or not there is an influence exerted on the layout.

In order to cope with the former case of the above two cases, an arrangement wiring technique for removing a pattern exceeding a lithography margin (lithography margin unachieved pattern) is developed. In addition thereto, a flow of layout processing is developed every device.

However, in order to cope with the latter case, since the design technique with which the timing convergence has been given a top priority has been made until now, any of primary factors making trade-off with the timing does not exist.

Here, repeater inserting processing is known as one of the timing convergence processing exerting an influence on a layout. The repeater is inserted into the middle of the wiring as may be necessary for the purpose of adjusting a delay in the wiring. Thus, a wiring pattern is divided into parts in a stage of a design, and an element such as a buffer is inserted between the parts obtained by dividing the wiring pattern, thereby adjusting a parasitic resistance and a parasitic capacitance of the wiring. The repeater is inserted when delay calculation after completion of RC extracting processing shows that there is a timing error. In this case, however, the layout changes after completion of cutting of the wiring because the wiring in the repeater insertion position is cut. For this reason, it is necessary to confirm whether or not the lithography unachieved pattern exists in the layout after completion of the processing.

Japanese Patent Laid-Open No. 2003-132111 proposes a technique about this respect. This technique is described as follows. RC networks obtained in consideration of a dispersion of wiring widths and wiring intervals are enumerated, sizes of a buffer and a transistor are changed based on a waveform of an input signal to a circuit, and finally one, having a minimum delay, of the RC networks thus obtained is selected to be adopted as a wiring layout.

In addition, Japanese Patent Laid-Open No. Hei 11-40785 discloses a technique with which a functional block exerting an influence on a timing is determined after a path exerting an influence after completion of delay calculation and timing verification is retrieved, and a buffer insertion optimal portion is retrieved. Moreover, there is also proposed a technique for changing connection of a wiring receiving an influence exerted thereon due to the buffer insertion.

SUMMARY OF THE INVENTION

However, with the above technique in the related art, it is not confirmed whether or not the lithography margin unachieved pattern exists in the result of the timing convergence processing. That is to say, it is difficult to investigate the influence exerted on the timing in the phase of changing the layout, and the influence exerted on the lithography in the phase of inserting the repeater because no interface exists between the flow of the timing convergence and the flow of the layout processing. For this reason, if the timing error should occur after the generation of the mask data, it is necessary to return the processing back to the stage of the layout, which results in that a time required for the development enormously increases. In addition, when the wiring is cut in the phase of the repeater insertion, a graphic having a short wiring length occurs, which causes the lithography error. This is a problem.

In the light of the foregoing, it is therefore desirable to provide a semiconductor device manufacturing method, a semiconductor device manufacturing program, and a semiconductor device manufacturing system in each of which attention is paid to repeater insertion as processing for timing convergence, and an influence exerted on a layout in a phase of insertion of a repeater is taken into consideration.

In order to attain the desire described above, according to an embodiment of the present invention, there is provided a method of manufacturing a semiconductor device, including the steps of: acquiring information on a graphic composing a physical layout of a semiconductor integrated circuit; carrying out calculation for a transferred image in the physical layout; carrying out calculation for a signal delay based on the physical layout, and obtaining a wiring not meeting a specification having the signal delay previously set therein; and setting a portion into which a repeater is to be inserted based on at least one result of results obtained from the information on the graphic and calculation for the transferred image, respectively, with respect to the wiring not meeting the specification.

In the embodiment of the present invention, when the repeater is inserted into the wiring not meeting the specification about the signal delay, the repeater is inserted into the portion for which at least one result of the results obtained from the information on the graphic of the physical layout, and the calculation for the transferred image, respectively, is taken into consideration. As a result, it is possible to carry out the repeater insertion for which the influence exerted on the layout in the phase of the repeater insertion is taken into consideration.

According to another embodiment of the present invention, there is provided a method of manufacturing a semiconductor device, including the steps of: acquiring information on a graphic composing a physical layout of a semiconductor integrated circuit; carrying out calculation for a transferred image and calculation for a stepped portion in the physical layout; carrying out calculation for a signal delay based on the physical layout, and obtaining a wiring not meeting a specification having the signal delay previously set therein; and setting a portion into which a repeater is to be inserted based on at least one result of results obtained from the information on the graphic, and the calculation for the stepped portion, respectively, with respect to the wiring not meeting the specification.

In the another embodiment of the present invention, when the repeater is inserted into the wiring not meeting the specification about the signal delay, the repeater is inserted into the portion for which at least one result of the results obtained from the information on the graphic of the physical layout, and the calculation for the stepped portion, respectively, is taken into consideration. As a result, it is possible to carry out the repeater insertion for which the influence exerted on the layout in the phase of the repeater insertion is taken into consideration.

According to still another embodiment of the present invention, there is provided a method of manufacturing a semiconductor device, including the steps of: acquiring information on a graphic composing a physical layout of a semiconductor integrated circuit; carrying out calculation for a transferred image in the physical layout; carrying out calculation for a signal delay based on the physical layout, and obtaining a wiring not meeting a specification having the signal delay previously set therein; and sending the information on the wiring not meeting the specification to a capacitance extracting system, and setting a portion into which a repeater is to be inserted based on the information on the wiring not meeting the specification in the capacitance extracting system.

In the still another embodiment of the present invention, when the information on the wiring not meeting the specification having the signal delay previously set therein is sent to the capacitance extracting system, and the repeater is inserted into the portion thus set in the capacitance extracting system, the repeater is inserted into the portion for which at least one result of the results obtained from the information on the graphic of the physical layout, and the calculation for the transferred image, respectively, is taken into consideration. As a result, it is possible to carry out the repeater insertion for which the influence exerted on the layout in the phase of the repeater insertion is taken into consideration. Here, the capacitance extracting system means a calculation system (for example, an RC extracting tool) for arithmetically operating a parasitic capacitance from the physical layout of the semiconductor integrated circuit.

According to yet another embodiment of the present invention, there is provided a method of manufacturing a semiconductor device, including the steps of: acquiring information on a graphic composing a physical layout of a semiconductor integrated circuit; carrying out calculation for a transferred image and calculation for a stepped portion in the physical layout; carrying out calculation for a signal delay based on the physical layout, and obtaining a wiring not meeting a specification having the signal delay previously set therein; and sending the information on the wiring not meeting the specification to an arrangement wiring system, and setting a portion into which a repeater is to be inserted based on the information on the wiring not meeting the specification in the arrangement wiring system.

In the yet another embodiment of the present invention, when the information on the wiring not meeting the specification having the signal delay previously set therein is sent to the arrangement wiring system, and the repeater is inserted into the portion thus set in the capacitance extracting system, the repeater is inserted into the portion for which at least one result of the results obtained from the information on the graphic of the physical layout, and the calculation for the transferred image, respectively, is taken into consideration. As a result, it is possible to carry out the repeater insertion for which the influence exerted on the layout in the phase of the repeater insertion is taken into consideration. Here, the arrangement wiring system means a calculation system (for example, an arrangement wiring tool) for generating graphic information on a physical layout from a semiconductor integrated circuit.

According to a further embodiment of the present invention, there is provided a program for manufacturing a semiconductor device, the program being adapted to instruct a computer to execute the steps of: acquiring information on a graphic composing a physical layout of a semiconductor integrated circuit; carrying out calculation for a transferred image in the physical layout; carrying out calculation for a signal delay based on the physical layout, and obtaining a wiring not meeting a specification having the signal delay previously set therein; and setting a portion into which a repeater is to be inserted based on at least one result of results obtained from the information on the graphic and calculation for the transferred image, respectively, with respect to the wiring not meeting the specification.

In the further embodiment of the present invention, when the repeater is inserted into the wiring not meeting the specification about the signal delay, the repeater is inserted into the portion for which at least one result of the results obtained from the information on the graphic of the physical layout, and the calculation for the transferred image, respectively, is taken into consideration. As a result, it is possible to provide the program which is capable of carrying out the repeater insertion for which the influence exerted on the layout in the phase of the repeater insertion is taken into consideration.

According to a still further embodiment of the present invention, there is provided a program for manufacturing a semiconductor device, the program being adapted to instruct a computer to execute the steps of: acquiring information on a graphic composing a physical layout of a semiconductor integrated circuit; carrying out calculation for a transferred image in the physical layout; carrying out calculation for a stepped portion in the physical layout; carrying out calculation for a signal delay based on the physical layout, and obtaining a wiring not meeting a specification having the signal delay previously set therein; and setting a portion into which a repeater is to be inserted based on at least one result of results obtained from the information on the graphic, the calculation for the transferred image, and the calculation for the stepped portion, respectively.

In the still further embodiment of the present invention, when the repeater is inserted into the wiring not meeting the specification about the signal delay, the repeater is inserted into the portion for which at least one result of the results obtained from the information on the graphic of the physical layout, and the calculation for the stepped portion, respectively, is taken into consideration. As a result, it is possible to provide the program which is capable of carrying out the repeater insertion for which the influence exerted on the layout in the phase of the repeater insertion is taken into consideration.

According to a yet further embodiment of the present invention, there is provided a program for manufacturing a semiconductor device, the program being adapted to instruct a computer to execute the steps of: acquiring information on a graphic composing a physical layout of a semiconductor integrated circuit; carrying out calculation for a transferred image in the physical layout; carrying out calculation for a signal delay based on the physical layout, and obtaining a wiring not meeting a specification having the signal delay previously set therein; and sending the information on the wiring not meeting the specification to a capacitance extracting system, and setting a portion into which a repeater is to be inserted based on at least one result of results obtained from the information on the graphic, and the calculation for the transferred image, respectively.

In the yet further embodiment of the present invention, when the information on the wiring not meeting the specification having the signal delay previously set therein is sent to the capacitance extracting system, and the repeater is inserted into the portion not meeting the specification in the capacitance extracting system, the repeater is inserted into the portion for which at least one result of the results obtained from the information on the graphic of the physical layout, and the calculation for the transferred image, respectively, is taken into consideration. As a result, it is possible to provide the program which is capable of carrying out the repeater insertion for which the influence exerted on the layout in the phase of the repeater insertion is taken into consideration. Here, the capacitance extracting system means the calculation system (for example, the RC extracting tool) for arithmetically operating the parasitic capacitance from the physical layout of the semiconductor integrated circuit.

According to an even further embodiment of the present invention, there is provided a program for manufacturing a semiconductor device, the program being adapted to instruct a computer to execute the steps of: acquiring information on a graphic composing a physical layout of a semiconductor integrated circuit; carrying out at least one of calculation for a transferred image in the physical layout, and calculation for a stepped portion in the physical layout; carrying out calculation for a signal delay based on the physical layout, and obtaining a wiring not meeting a specification having the signal delay previously set therein; and sending the information on the wiring not meeting the specification to an arrangement wiring system, and setting a portion into which a repeater is to be inserted based on at least one result of results obtained from the information on the graphic, the calculation for the transferred image, and the calculation for the stepped portion, respectively, with respect to the wiring not meeting the specification in the arrangement wiring system.

In the even further embodiment of the present invention, when the information on the wiring not meeting the specification having the signal delay previously set therein is sent to the arrangement wiring system, and the repeater is inserted into the capacitance extracting system, the repeater is inserted into the portion for which at least one result of the results obtained from the information on the graphic of the physical layout, and the calculation for the transferred image, respectively, is taken into consideration. As a result, it is possible to provide the program which is capable of carrying out the repeater insertion for which the influence exerted on the layout in the phase of the repeater insertion is taken into consideration. Here, the arrangement wiring system means the calculation system (for example, the arrangement wiring tool) for generating graphic information on a physical layout from a semiconductor integrated circuit.

According to an even further embodiment of the present invention, there is provided a system for manufacturing a semiconductor device, the system including a computer adapted to execute the steps of: acquiring information on a graphic composing a physical layout of a semiconductor integrated circuit; carrying out at least one of calculation for a transferred image, and calculation for a stepped portion in the physical layout; carrying out calculation for a signal delay based on the physical layout, and obtaining a wiring not meeting a specification having the signal delay previously set therein; and setting a portion into which a repeater is to be inserted based on at least one result of results obtained from the information on the graphic, and the calculation for the transferred image, respectively, with respect to the wiring not meeting the specification.

In the even further embodiment of the present invention, when the repeater is inserted into the wiring not meeting the specification about the signal delay, the repeater is inserted into the portion for which at least one result of the results obtained from the information on the graphic of the physical layout, and the calculation for the transferred image, respectively, is taken into consideration. As a result, it is possible to provide the manufacturing system which is capable of carrying out the repeater insertion for which the influence exerted on the layout in the phase of the repeater insertion is taken into consideration.

According to an even further embodiment of the present invention, there is provided a system for manufacturing a semiconductor device, the system including a computer adapted to execute the steps of: acquiring information on a graphic composing a physical layout of a semiconductor integrated circuit; carrying out calculation for a transferred image in the physical layout; carrying out calculation for a stepped portion in the physical layout; carrying out calculation for a signal delay based on the physical layout, and obtaining a wiring not meeting a specification having the signal delay previously set therein; and setting a portion into which a repeater is to be inserted based on at least one result of results obtained from the information on the graphic, the calculation for the transferred image, and the calculation for the stepped portion, respectively.

In the even further embodiment of the present invention, when the repeater is inserted into the wiring not meeting the specification about the signal delay, the repeater is inserted into the portion for which at least one result of the results obtained from the information on the graphic composing the physical layout, the calculation for the transferred image, and the calculation for the transferred image is taken into consideration. As a result, it is possible to provide the manufacturing system which is capable of carrying out the repeater insertion for which the influence exerted on the layout in the phase of the repeater insertion is taken into consideration.

In addition, according to an even further embodiment of the present invention, there is provided a system for manufacturing a semiconductor device, the system including a computer adapted to execute the steps of: acquiring information on a graphic composing a physical layout of a semiconductor integrated circuit; carrying out at least one of calculation for a transferred image in the physical layout, and calculation for a stepped portion in the physical layout; carrying out calculation for a signal delay based on the physical layout, and obtaining a wiring not meeting a specification having the signal delay previously set therein; and sending information on the wiring not meeting the specification to a capacitance extracting system, and setting a portion in which a repeater is to be inserted based on at least one result of results obtained from the information on the graphic, and the calculation for the transferred image, respectively, with respect to the wiring not meeting the specification in the capacitance extracting system.

In the even further embodiment of the present invention, when the information on the wiring not meeting the specification having the signal delay previously set therein is sent to the capacitance extracting system, and the repeater is inserted into the portion thus obtained in the capacitance extracting system, the repeater is inserted into the portion for which at least one result of the results obtained from the information on the graphic composing the physical layout, and the calculation for the transferred image, respectively, is taken into consideration. As a result, it is possible to provide the manufacturing system which is capable of carrying out the repeater insertion for which the influence exerted on the layout in the phase of the repeater insertion is taken into consideration. Here, the capacitance extracting system means the calculation system (for example, the RC extracting tool) for arithmetically operating the parasitic capacitance from the physical layout of the semiconductor integrated circuit.

Also, according to an even further embodiment of the present invention, there is provided a system for manufacturing a semiconductor device, the system including a computer adapted to execute the steps of: acquiring information on a graphic composing a physical layout of a semiconductor integrated circuit; carrying out calculation for a transferred image in the physical layout, and calculation for a stepped portion in the physical layout; carrying out calculation for a signal delay based on the physical layout, and obtaining a wiring not meeting a specification having the signal delay previously set therein; and sending the information on the wiring not meeting the specification to an arrangement wiring system, and setting a portion into which a repeater is to be inserted based on at least one result of results obtained from the information on the graphic, the calculation for the transferred image, and the calculation for the stepped portion, respectively, with respect to the wiring not meeting the specification in the arrangement wiring system.

In the even further embodiment of the present invention, when the information on the wiring not meeting the specification having the signal delay previously set therein is sent to the arrangement wiring system, and the repeater is inserted into the capacitance extracting system, the repeater is inserted into the portion for which at least one result of the results obtained from the information on the graphic of the physical layout, and the calculation for the transferred image, respectively, is taken into consideration. As a result, it is possible to provide the manufacturing system which is capable of carrying out the repeater insertion for which the influence exerted on the layout in the phase of the repeater insertion is taken into consideration. Here, the arrangement wiring system means the calculation system (for example, the arrangement wiring tool) for generating graphic information on a physical layout from a semiconductor integrated circuit.

According to the present invention, the repeater can be adequately inserted into the lithography margin unachieved pattern of the wiring not meeting the specification having the signal delay previously set. Also, it is possible to prevent the backing of the design flow. As a result, it is possible to increase the efficiency of the entire design flow.

DETAILED DESCRIPTION OF THE PREFERRED EMBODIMENTS

Figure 1:
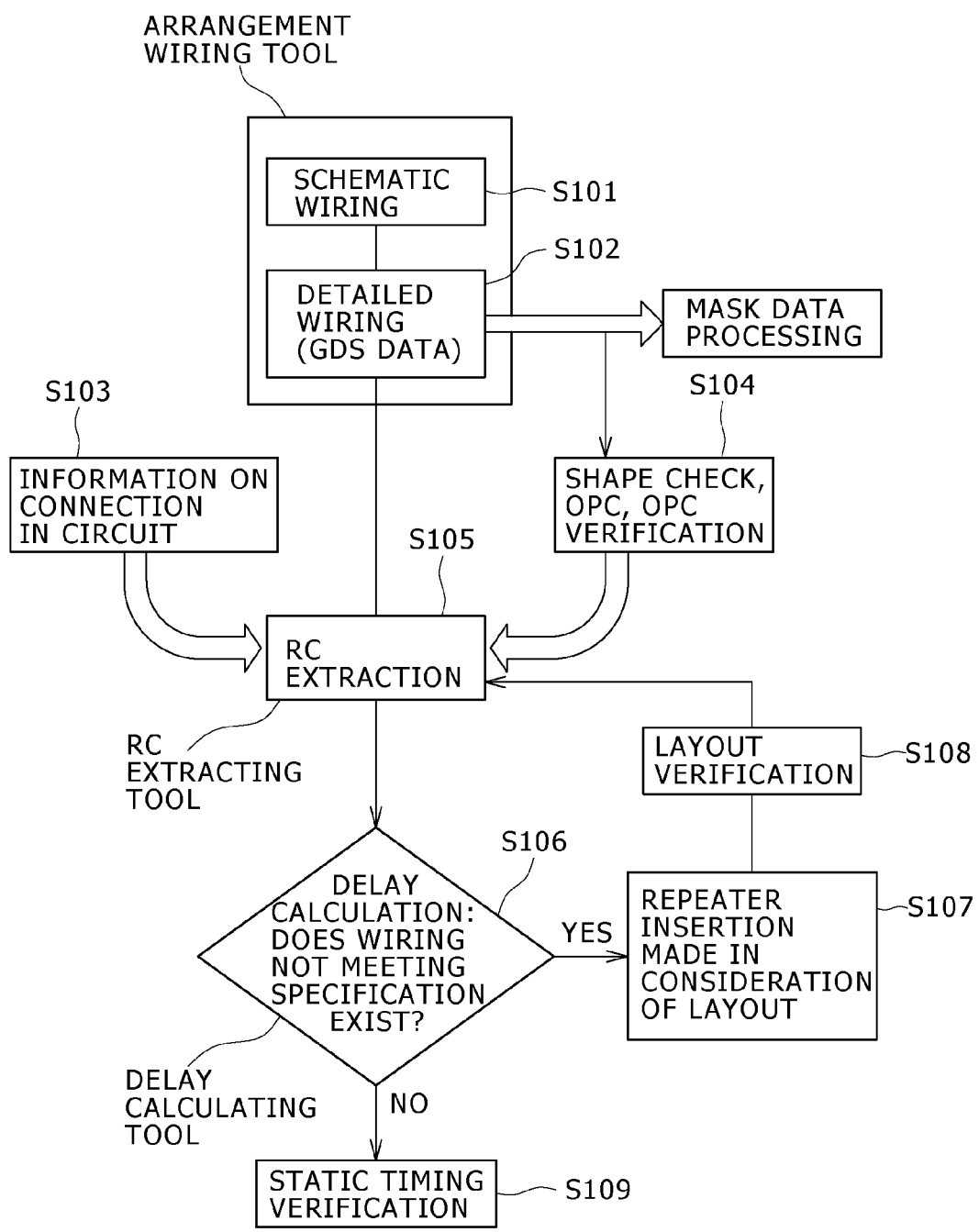
FIG. 1 is a flow chart explaining a method of manufacturing a semiconductor device according to a first embodiment of the present invention.

The preferred embodiments of the present invention will be described in detail hereinafter with reference to the accompanying drawings.

Outline of Processing

The feature of the present invention is that when a repeater composed of an element such as a buffer is inserted into a predetermined wiring for the purpose of adjusting a signal delay in a circuit in design support for a semiconductor integrated circuit as an object of manufacture, the repeater is inserted in consideration of an influence of lithography.

A method of manufacturing a semiconductor device according to any of embodiments of the present invention principally includes the following steps as will be described below.

(a) A step acquiring information on a graphic composing a physical layout of a semiconductor integrated circuit.

(b) A step of carrying out calculation for a transferred image, and calculation for a stepped portion in the physical layout.

(c) A step of carrying out calculation for a signal delay based on the physical layout, and obtaining a wiring not meeting a specification having the signal delay previously set therein.

(d) A step of setting a portion into which a repeater is to be inserted based on at least one result of results obtained from the information on the graphic, the calculation for the transferred image, and the calculation for the stepped portion, respectively, with respect to the wiring not meeting the specification having the signal delay previously set therein.

More specifically, firstly, an arrangement wiring tool (referred to "an arrangement wiring system" as well) generates graphic data (data having a GDS format) composing a physical layout from the physical layout obtained after completion of a detailed wiring of a semiconductor integrated circuit as an object of the manufacture. Also, the arrangement wiring tool inputs the resulting graphic data to a shape checking system.

Next, the shape checking system carries out a transfer simulation and a stepped portion simulation for the layout, thereby generating a coordinate value list of a portion in which a wiring width and a wiring length do not meet a predetermined photolithography condition, that is, a specification unachieved portion (lithography margin unachieved pattern). In addition, an RC extracting tool (referred to as "an RC extracting system" as well) extracts a parasitic capacitance value and a parasitic resistance value of a circuit, and calculates a signal delay in the circuit, thereby obtaining a wiring not meeting the specification. Here, the parasitic resistance value R of the circuit is calculated from a wiring cross sectional area A obtained from a wiring thickness and a wiring width, a wiring length L, and an electrical resistivity $\rho$. For this reason, the parasitic resistance value R of the circuit is obtained from calculation of R $=\rho \times L/A$ by using the result of the transfer simulation, and the result of the stepped portion simulation. The parasitic resistance value R of the circuit may be used as the specification. In this case, wirings each having the parasitic resistance value R, obtained from the above calculation, which does not meet a predetermined value are obtained.

Next, a buffer is selectively inserted into a portion of the wiring, of the wirings each not meeting the above specification, having the coordinate value on the physical layout as the lithography margin unachieved pattern in the region of not violating a restriction of a floor plan about the arrangement wiring and the like. Also, the check for signal delay calculation (timing check) is carried out again. After that, when there is no problem in timing check, the data on the physical layout is outputted to a subsequent stage (for example, a mask data processing system). With such a method, the shape check is carried out for the physical layout after completion of the detailed wiring, which results in that it is possible to adequately extract a repeater insertion recommended position.

First Embodiment

Next, a description will be given with respect to a method of manufacturing a semiconductor device according to a first embodiment of the present invention. It is noted that a flow of a method of manufacturing a semiconductor device in the related art will now be described in brief for comparison with the first embodiment prior to the description of the first embodiment.

Figure 7:
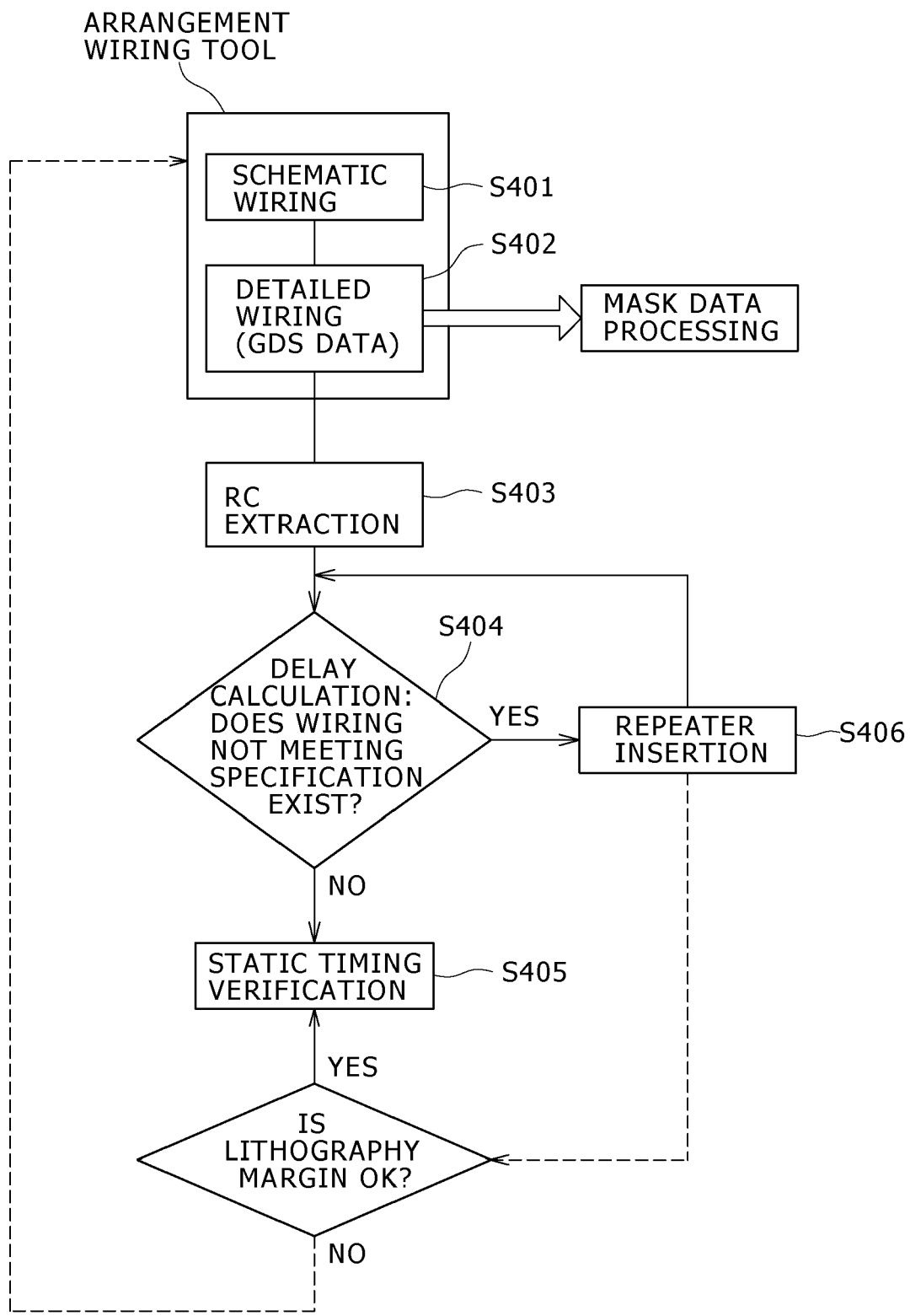
FIG. 7 is a flow chart explaining a method of manufacturing a semiconductor device in the related art.

FIG. 7 is a flow chart explaining a method of manufacturing a semiconductor device in the related art. That is to say, with the manufacturing method in the related art, graphic data (data having a GDS format) on a physical layout which is generated by executing processing for a schematic wiring (Step S401) and processing for a detailed wiring (Step S402) by using an arrangement wiring tool is sent to a section for executing mask data processing.

On the other hand, RC extracting processing (Step S403), and delay calculation processing (Step S404) are executed as timing convergence processing. When there is an error (timing error) not meeting a specification previously set based on the delay calculation processing, a repeater is inserted as one of methods coping with the error (Step S406). After completion of the insertion of the repeater, the delay calculation processing is executed again. Then, when the signal delay meets the specification previously set, static timing analyzing processing is executed (Step S405).

Figure 8:
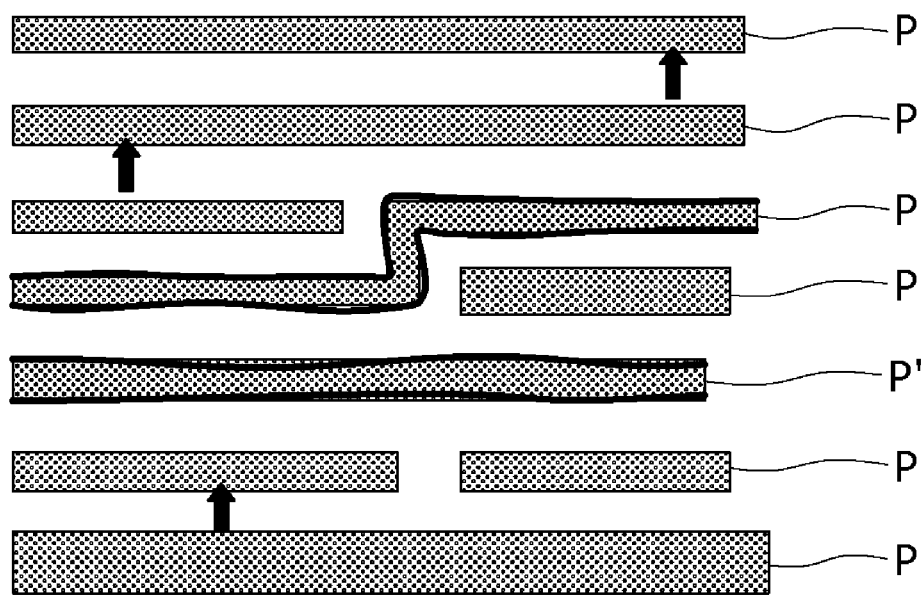
FIG. 8 is a schematic view showing portions into each of which a repeater is to be inserted by utilizing the method of manufacturing a semiconductor device in the related art.

FIG. 8 is a schematic view showing portions into each of which a repeater is to be inserted by utilizing the method of manufacturing a semiconductor device in the related art. The repeater is inserted into positions, each indicated by an arrow, in wiring patterns P shown in FIG. 8. Although the repeater insertion positions are portions each having a long wiring length, in FIG. 8, the positions into each of which the repeater is inserted are selected for the portions each having a long wiring length without taking a layout in the vicinities thereof into consideration. Therefore, after completion of the insertion of the repeater, a graphic having a short wiring length is generated and thus the lithography margin unachieved pattern is newly generated in some cases. In addition, in spite of presence of a long wiring P' having the lithography margin unachieved pattern, no repeater is inserted into the long wiring P'.

With the manufacturing method in the related art, since the mask data processing and the timing convergence processing are executed independently of each other, it is not taken into consideration that the above graphic having the short wiring length is generated. Therefore, no lithography margin check is carried out after completion of the insertion of the repeater as shown in FIG. 7. However, if the lithography margin check is carried out, as indicated by a broken line in FIG. 7, presence or absence of the lithography margin unachieved pattern is confirmed next to the static timing analyzing processing (Step S405). In the case of presence of the lithography margin unachieved pattern, it is necessary that the operation returns back to the processing in the arrangement wiring tool, and the layout is then corrected. In this case, a processing time increases due to the backing in operation.

Next, a description will be given with respect to a method of manufacturing a semiconductor device according to the first embodiment of the present invention. FIG. 1 is a flow chart explaining the method of manufacturing a semiconductor device according to the first embodiment of the present invention. The first embodiment of the present invention is different from the related art previously stated in that shape checking processing, optical proximity correcting (OPC) processing, and OPC verifying processing are executed with respect to graphic data on a physical layout generated by an arrangement wiring tool.

Describing step by step, firstly, graphic data (data having a GDS format) on a physical layout which is generated by executing processing for a schematic wiring (Step S101) and processing for a detailed wiring (Step S102) by using an arrangement wiring tool is sent to a section for executing mask data processing.

On the other hand, RC extracting processing (Step S105) is executed as timing convergence processing by an RC extracting tool. In addition, there are executed processing for sending information on connection in a circuit to the RC extracting tool (Step S103), shape checking processing based on graphic data on a physical layout generated in the arrangement wiring tool, the OPC processing, and OPC verifying processing (Step S104).

In the shape checking processing, information on a portion having a long wiring length equal to or longer than a preset length is extracted from the graphic data on the physical layout. The information on the portion thus extracted is held as the coordinates on the physical layout. In addition, the OPC processing and the OPC verifying processing are executed, thereby extracting a lithography margin unachieved pattern.

The results of execution of the shape checking processing and the OPC verifying processing (a position of the lithography margin unachieved pattern) is inputted to the RC extracting tool. The information inputted to the RC extracting tool (the information on the connection in the circuit, and the results of execution of the shape checking processing and the OPC verifying processing) is used when a timing error occurs in delay calculation after completion of the RC extracting processing. That is to say, a delay calculation tool calculates a signal delay in the circuit (Step S106). When the timing error not meeting a specification previously set occurs, a repeater is inserted as one of methods coping with the timing error (Step S107).

In the first embodiment, the repeater insertion position is set as an insertion position (the position of the lithography margin unachieved pattern) for which the layout is taken into consideration by using the information on the shape check and the information on the lithography margin check which are inputted to the RC extracting tool, and the information on the connection in the circuit.

The signal delay in the wiring in the circuit increases in proportion to a square of a wiring length. Therefore, when there is the timing error, the repeater composed of an element such as a buffer is inserted into the middle of the wiring to cut the wiring, thereby adjusting the delay. In such a manner, the timing error can be improved. In this case, the repeater insertion position is set as a position having a long wiring length and the lithography margin unachieved pattern, thereby making it possible to remove the lithography margin unachieved pattern concurrently with an improvement in the timing error. That is to say, the repeater can be selectively inserted into the position which is advantageous for both these factors.

Here, a repeater insertion process (Step S107) in the first embodiment will be described in detail. Firstly, the results of execution of the shape checking processing and lithography margin checking processing described above are inputted to the RC extracting tool. The RC extracting tool serves to extract a parasitic capacitance value and a parasitic resistance value in a semiconductor integrated circuit as an object of the manufacture in a preceding stage of the delay calculation. In this case, this function is utilized in this embodiment because the information on the physical layout of the circuit is treated in the RC extracting tool.

That is to say, the RC extracting tool is provided with a function of inputting or outputting the information on the physical layout in executing the RC extracting processing. Therefore, it is possible to additionally input the information on the result of execution of the shape checking processing for the physical layout, and the information on the results of execution of the lithography margin checking processing such as the OPC processing and the OPC verifying processing. In the shape checking processing described above, there are checked distributions of the wiring widths and the wiring lengths based on the GDS data (the graphic data on the physical layout) outputted after completion of the execution of the arrangement wiring processing.

Figure 2A:
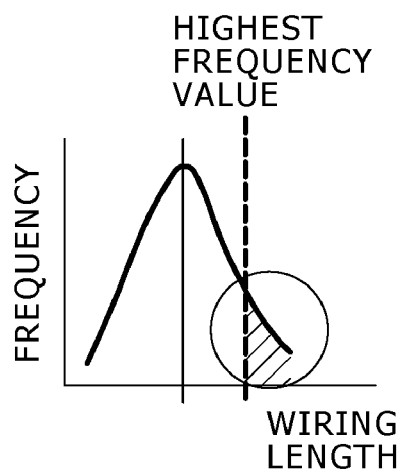
FIGS. 2A, 2B and 2C are respectively graphical representations explaining results of shape checking processing.
Figure 2B:
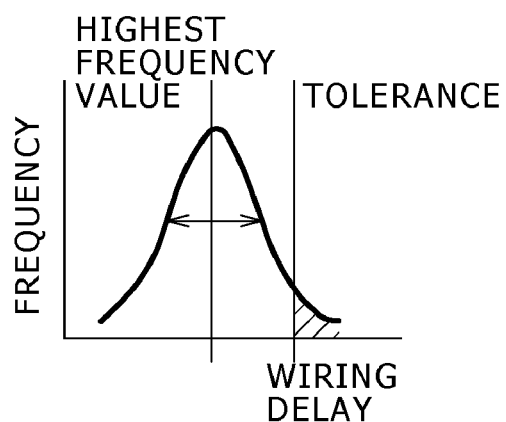
Figure 2C:
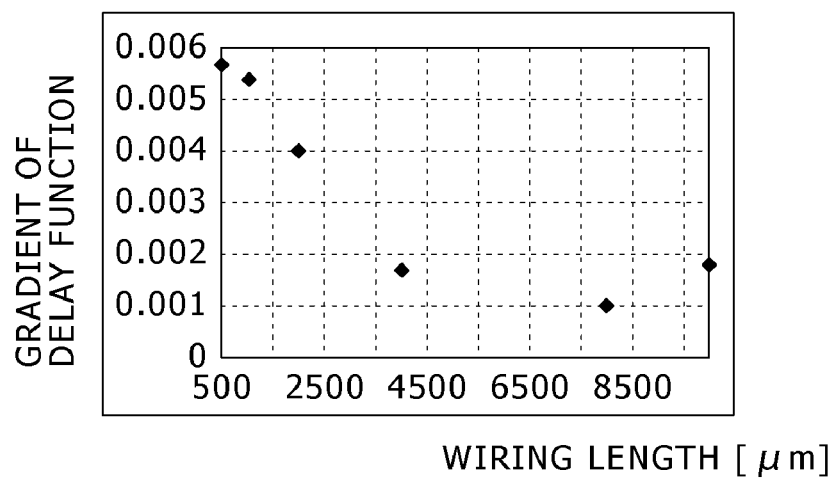

The shape checking processing means a method of checking line widths, line lengths and the like in the graphic composing the layout by, for example, utilizing a design rule checking system. FIGS. 2A and 2B show histograms about the results of execution of the shape checking processing. In FIG. 2A, an axis of abscissa represents a wiring length, and an axis or ordinate represents a frequency of each wiring length. In addition, in FIG. 2B, an axis of abscissa represents a wiring delay when the wiring lengths shown in FIG. 2A are assumed, and an axis of ordinate represents a frequency of each wiring delay. Also, each value of the wiring delays lying on the right-hand side of a tolerance is a value exceeding a threshold of the wiring delay. A range obtained when the wiring delays in the range shown in FIG. 2B are converted into the wiring lengths is indicated by a circle of FIG. 2A. In addition, the conversion between the wiring lengths of FIG. 2A and the wiring delays of FIG. 2B are carried out by using a graph shown in FIG. 2C. In FIG. 2C, an axis of abscissa represents the wiring length, and an axis of ordinate represents a gradient of a delay function when the delay calculation is carried out with a model circuit, a capacitance value, and a resistance value being specified.

That is to say, the graph of FIG. 2C shows that as the wiring length becomes long in the model circuit used in this embodiment, the gradient of the delay function becomes small, that is, the operation speed becomes slow. Therefore, it is necessary to cut any of the wirings having the respective wiring lengths with each of which the wiring delay is equal to or longer than a predetermined value (a portion of the wiring lengths indicated by slant lines in the circle of FIG. 2A). In other words, when the wiring lengths indicated by the slant lines in the circle of FIG. 2A exist in the layout, the repeater will be inserted into each of portions having these wiring lengths.

Note that, in the example shown in FIGS. 2A to 2C, the tolerance is set from a viewpoint of determining whether or not the wiring lengths meet a specification determined based on a restriction to the delay calculation, the capacitance value and the resistance value in the circuit. However, it is better to use a tolerance about at least one of the wiring width, and the thicknesses of a metal and an interlayer insulating film composing elements of the semiconductor integrated circuit in addition to the wiring length.

Moreover, in the first embodiment, the OPC processing and the OPC verifying processing are executed for the physical layout, thereby obtaining the information on the lithography margin unachieved pattern. Also, the repeater insertion portions are determined by using the information on the resulting lithography margin unachieved pattern.

As an example, an exposure wavelength of 193 nm, NA of 0.75, σ of 0.85, and an orbicular zone of ⅔ are set as optical conditions for a transfer simulation for the OPC processing and the lithography margin checking processing. Also, an exposure amount is changed 0.5 mJ by 0.5 mJ with 13.5 mJ as a center, and a defocus amount having a range of ±0.2 µm is calculated 0.05 µm by 0.05 µm. It is noted that for a set value in a dose focus condition, a line and space of 100 nm is used as a target. In addition, the OPC processing may be executed or may not be executed as long as the lithography margin unachieved pattern can be extracted.

Figure 3:
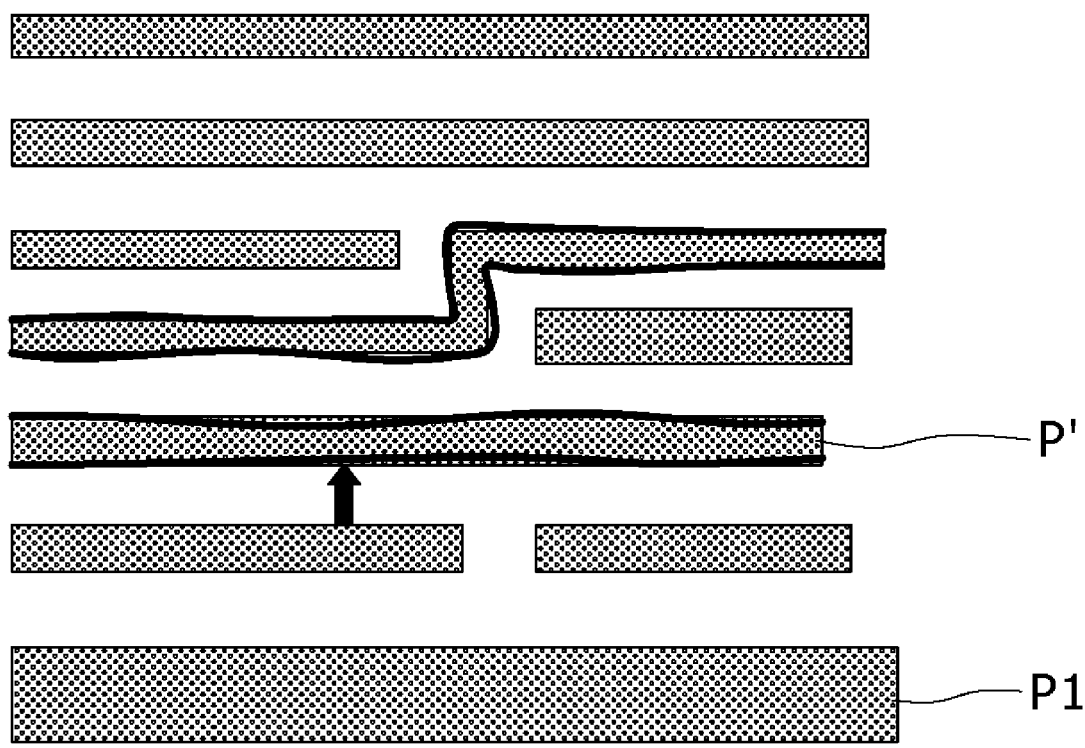
FIG. 3 is a schematic view explaining a portion into which a repeater is to be inserted in the first embodiment of the present invention.

Here, a large number of lithography margin unachieved patterns, for example, as shown in FIG. 3, exist in lines near a line P1 having a thick wiring width. When lines each having a width of 100 nm exist in the vicinity of a line having a width of 150 nm or more, the line width of 100 nm of the lines is narrowed so that the lines each having the line width of 100 nm becomes the lithography margin unachieved patterns, respectively. When the lines each having the line width of 100 nm are shortened (the wirings are cut) in the portions in which the lines each having the line width of 100 nm are narrowed, it is possible to reduce the number of lithography margin unachieved patterns.

The data on the positions (coordinates) of such lithography margin unachieved patterns is inputted to the RC extracting tool, and the information on the connection in the circuit is then referred. In this case, when it is necessary to insert the repeater into desired one(s) of the lithography margin unachieved patterns, the repeater can be selectively inserted into the lithography margin unachieved patterns.

The positions of the lithography margin unachieved patterns can be obtained from the information on the connection in the circuit, and the result of calculation for the stepped portion simulation as well as from the result of calculation for a transferred image. In addition, the positions of the lithography margin unachieved patterns may also be obtained from plural information, i.e., the result of calculation for the transferred image, the information on the connection in the circuit, and the result of calculation for the stepped portion simulation. In the case where the positions of the lithography margin unachieved pattern are specified from the information on the connection in the circuit, it is estimated that each of the positions thereof is slightly shifted as compared with the case where the positions of the lithography margin unachieved pattern are specified from the result of calculation for the transferred image. However, a precision of a level of 1 mm is not necessarily required from a viewpoint of the purpose of cutting the wire.

The repeater insertion position selected in the first embodiment is indicated by an arrow in FIG. 3. The wiring line indicated by the arrow is a long wiring P' existing in the vicinity of the thick wiring line P1. When viewing the transferred image (indicated by a heavy solid line in FIG. 3), it is understood that the wiring width is narrow in the vicinity including a position indicated by the arrow is narrow. From this fact, it is advantageous from a viewpoint of the lithography margin to insert the repeater into this position.

In the first embodiment, the physical layout in which the repeater is inserted into that position in such a manner is verified again, and it is then confirmed that there is no new problem (Step S108). Also, delay calculating processing (Step S106), and static timing analyzing processing (Step S109) are executed.

As just described above, in the first embodiment, after completion of the insertion of the repeater, the lithography margin checking processing, and the timing verifying processing are executed again. Here, the layout verifying processing (Step S108) can be omitted if being unnecessary. The case where it is unnecessary to execute the layout verifying processing is the case where it is possible to clearly determine that no lithography margin unachieved pattern newly occurs because of a slight change in layout.

It is noted that in the first embodiment, the conditions for the OPC processing and OPC verifying processing described above can be individually set depending on the semiconductor integrated circuit as an object of the manufacture. In addition, the shape checking processing may also depend on the analysis about the layout and the wafer image, the film thickness distribution or the like in addition to utilization of the design rule checking system. In addition, an example, of the layout of the repeater insertion, used in the first embodiment is merely an example of a technical drawing of a circuit.

Figure 6:
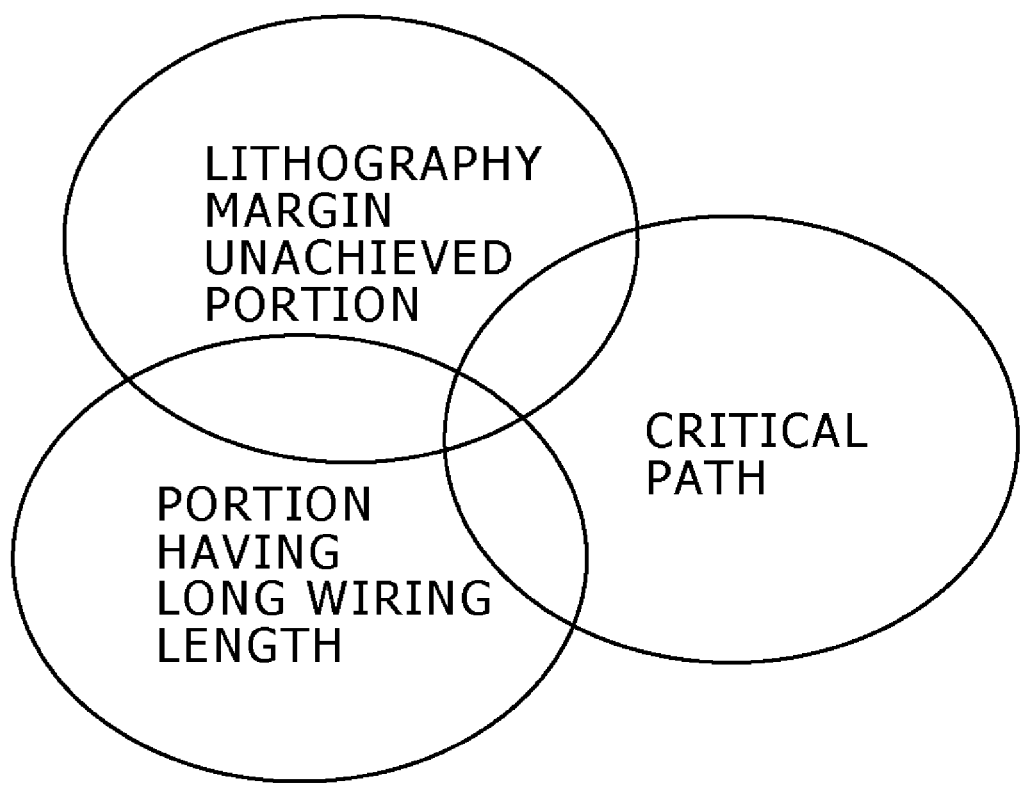
FIG. 6 is a schematic view explaining overlapping among various conditions.

Moreover, although in the first embodiment, the repeater is selectively inserted into the portion having the long wiring length and the lithography margin unachieved pattern, the present invention is by no means limited to this condition. For example, as shown in FIG. 6, the insertion condition may also be set depending on the purpose so that the repeater is selectively inserted into a portion meeting the condition in which at least two conditions of the three conditions of the lithography margin unachieved pattern, the portion having the long wiring length, and the critical path overlap each other.

In addition, in the first embodiment, the example in which the portion having the long wiring length equal to or longer than the predetermined length is extracted from the graphic data on the physical layout of the semiconductor integrated circuit has been described as the shape checking processing. However, processing in which stepped portions of the wirings are detected from the cross sectional structure of the physical layout, the stepped portion of the wiring having the size equal to or larger than a preset value is extracted from these stepped portions of the wirings, and the stepped portion of the wiring thus extracted is made a candidate of the repeater insertion portion may also be adopted as shape checking processing other than the shape checking processing described above.

Second Embodiment

Next, a description will be given with respect to a method of manufacturing a semiconductor device according to a second embodiment of the present invention. The feature of the second embodiment of the present invention is that sections for executing the shape checking processing, the OPC processing, and the OPC verifying processing, respectively, in the first embodiment previously described are built in the RC extracting tool (RC extracting system).

Figure 4:
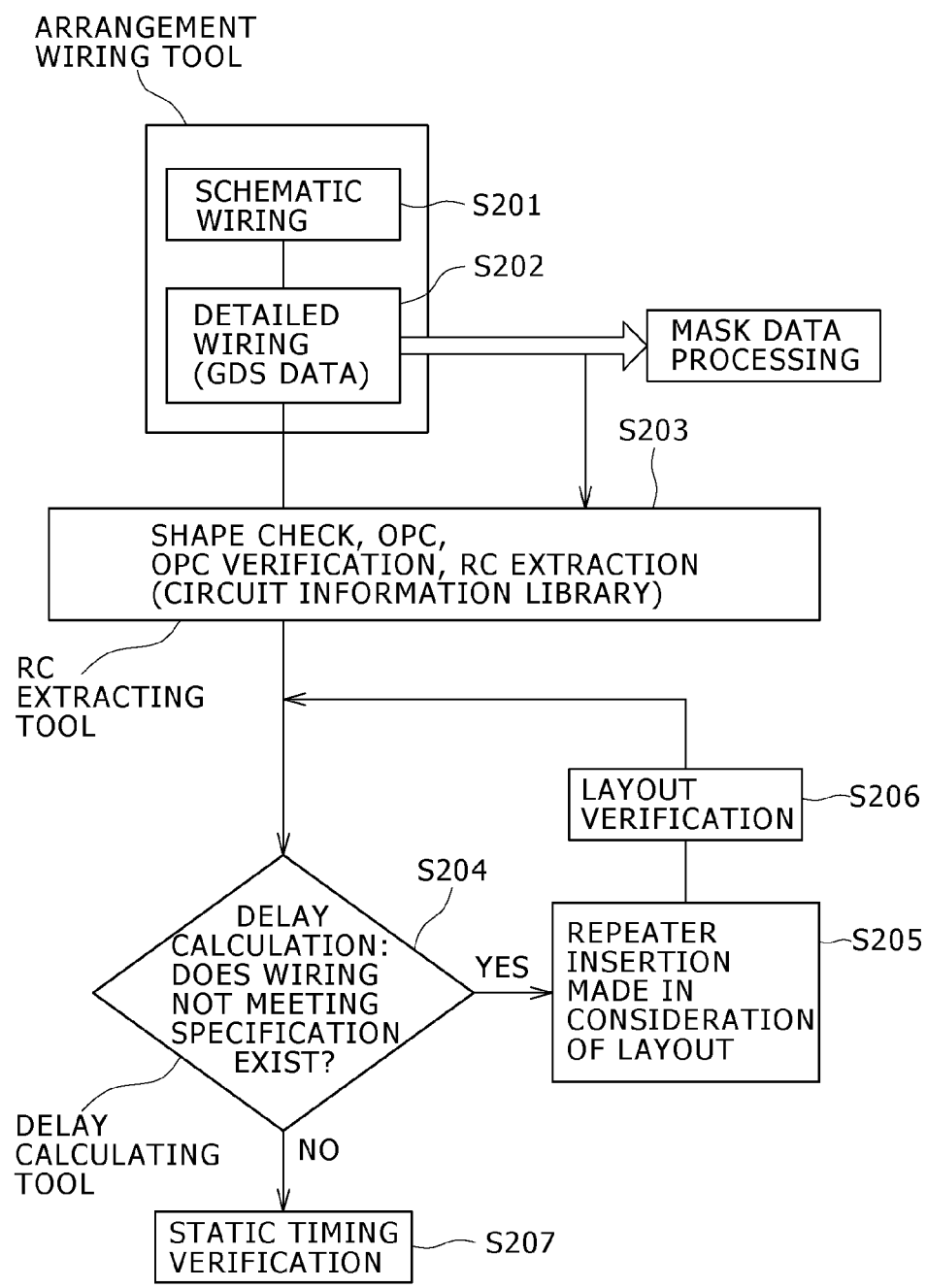
FIG. 4 is a flow chart explaining a method of manufacturing a semiconductor device according to a second embodiment of the present invention.

FIG. 4 is a flow chart explaining the method of manufacturing the semiconductor device according to the second embodiment of the present invention. Firstly, graphic data (data having the GDS format) on a physical layout generated by executing schematic wiring processing (Step S201) and detailed wiring processing (Step S202) by using the arrangement wiring tool is sent to the section for executing mask data processing.

On the other hand, the graphic data on the physical layout thus generated is sent to the RC extracting tool. Also, the RC extracting tool executes the shape checking processing, the OPC processing, the OPC verifying processing, and the RC extracting processing (Step S203). That is to say, the RC extracting tool extracts data on a portion having a long wiring length equal to or longer than a preset length from the graphic data on the physical layout after completion of the detailed wiring processing. In addition, the RC extracting tool executes the OPC processing and the OPC verifying processing based on the graphic data on the physical layout, thereby extracting the lithography margin unachieved patterns. The conditions for the OPC processing and the OPC verifying processing, and the contents of the lithography margin check may be identical to those in the first embodiment previously described.

In the shape checking processing, information on a portion having a long wiring length equal to or longer than a preset length is extracted from the graphic data on the physical layout. The information on the portion thus extracted is held as the coordinates on the physical layout.

In addition, in the processing for verifying the lithography margin unachieved patterns, the OPC processing and the OPC verifying processing are executed, thereby extracting information on portions in each of which a predetermined lithography margin is not achieved. It is noted that the positions of the lithography margin unachieved patterns can be obtained from the information on the connection in the circuit, and the result of calculation for the stepped portion simulation as well as from the result of calculation for the transferred image. In addition, the positions of the lithography margin unachieved patterns may also be obtained from plural information, i.e., the result of calculation for the transferred image, the information on the connection in the circuit, and the result of calculation for the stepped portion simulation.

After that, the result of execution of the shape checking processing, and the result of execution of the lithography margin unachieved pattern verifying processing are both held. Also, the delay calculation tool calculates a signal delay in the circuit (Step S204).

As a result, when it is determined that it is necessary to carry out the repeater insertion because a timing error occurs, a repeater insertion portion is extracted based on the information on the result of execution of the shape checking processing, and the information on the result of execution of the lithography margin unachieved pattern verifying processing which are previously held in combination with the circuit connection information, and the repeater is inserted into the repeater insertion portion thus extracted (Step S205).

The portion into which the repeater is to be inserted is a position indicated by an arrow in FIG. 3 similarly to the case of the first embodiment. In addition, processing for carrying out layout verification for the physical layout after completion of the repeater insertion (Step S206), and it is confirmed that no lithography margin unachieved portion newly occurs. Also, static timing analyzing processing is executed (Step S207). Here, the layout verifying processing (Step S206) can be omitted if being-unnecessary. The case where it is unnecessary to execute the layout verifying processing is the case where it is possible to clearly determine that no lithography margin unachieved pattern newly occurs because of a slight change in layout.

In the second embodiment, the processing efficiency can be enhanced as compared with the case of the first embodiment because the input of the information on the result of execution of the shape checking processing, and the information on the connection in the circuit to the RC tool becomes unnecessary although being necessary in the first embodiment. That is to say, the lithography verifying processing is executed in the RC extracting tool, thereby omitting an extra time required for input/output of the data. As a result, it is possible to shorten the processing time.

It is noted that in the first embodiment, the conditions for the OPC processing and OPC verifying processing described above can be individually set depending on the semiconductor integrated circuit as an object of the manufacture. In addition, the shape checking processing may also depend on the analysis about the layout and the wafer image, the film thickness distribution or the like in addition to utilization of the design rule checking system. In addition, an example, of the layout of the repeater insertion, used in the second embodiment is merely an example of a technical drawing of a circuit.

Moreover, although in the second embodiment, the repeater is selectively inserted into the portion having the long wiring length and the lithography margin unachieved pattern, the present invention is by no means limited to this condition. For example, as shown in FIG. 6, the insertion condition may also be set depending on the purpose so that the repeater is selectively inserted into a portion meeting the condition in which at least two conditions of the three conditions of the lithography margin unachieved pattern, the portion having the long wiring length, and the critical path overlap each other.

In addition, in the second embodiment, the example in which the portion having the long wiring length equal to or longer than the preset length is extracted from the graphic data on the physical layout of the semiconductor integrated circuit has been described as the shape checking processing. However, the processing in which stepped portions of the wirings are detected from the cross sectional structure of the physical layout, the stepped portion of the wiring having the size equal to or larger than a preset value is extracted from these stepped portions of the wirings, and the stepped portion of the wiring thus extracted is made a candidate of the repeater insertion portion may also be adopted as shape checking processing other than the shape checking processing described above.

Third Embodiment

Next, a description will be given with respect to a method of manufacturing a semiconductor device according to a third embodiment of the present invention. The feature of the third embodiment is that the timing error checking processing based on the shape checking processing, the OPC processing, the OPC verifying processing, and the delay calculating processing in the first embodiment previously described is executed in the arrangement wiring tool (arrangement wiring system).

Figure 5:
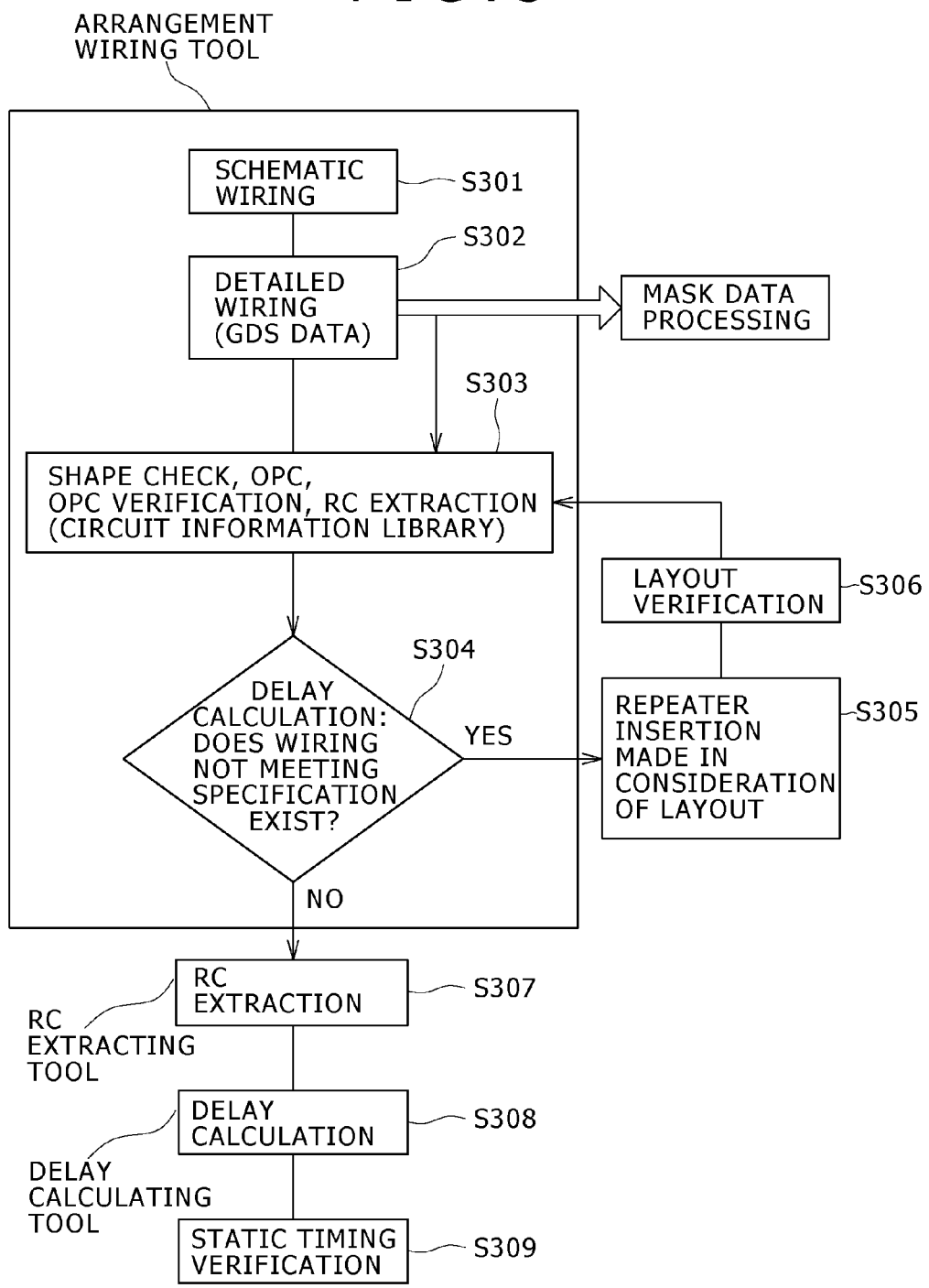
FIG. 5 is a flow chart explaining a method of manufacturing a semiconductor device according to a third embodiment of the present invention.

FIG. 5 is a flow chart explaining the method of manufacturing a semiconductor device according to the third embodiment of the present invention. Firstly, graphic data (data having the GDS format) on a physical layout generated by executing schematic wiring processing (S301) and detailed wiring processing (Step S302) in the arrangement wiring tool is sent to the section for executing mask data processing.

Next, the shape checking processing is executed in the arrangement wiring tool, and thus a graphic having a portion having a long wiring length is extracted and also the RC extracting processing is executed (Step S303). In the shape checking processing, information on a portion having a long wiring length equal to or longer than a preset length is extracted from the graphic data on the physical layout after completion of the detailed wiring. The information on the portion thus extracted is held as the coordinates on the physical layout.

In addition, the arrangement wiring tool executes the OPC processing and the OPC verifying processing based on the graphic data on the physical layout, thereby extracting the lithography margin unachieved patterns. The conditions for the OPC processing and the OPC verifying processing and the contents of the lithography margin checking processing may be identical to those in the first embodiment previously described. It is noted that the portions of the lithography margin unachieved patterns can be obtained from the information on the connection in the circuit, and the result of calculation for the stepped portion simulation as well as from the result of calculation for the transferred image. In addition, the portions of the lithography margin unachieved patterns may also be obtained from plural information, i.e., the result of calculation for the transferred image, the information on the connection in the circuit, and the result of calculation for the stepped portion simulation.

In the processing until now, the shape checking processing is obtained, the portions each having wiring length not meeting the specification about the characteristics, and the lithography margin unachieved patterns are executed, and the information thereon is then held.

Next, the arrangement wiring tool calculates a capacitance value and a resistance value by using either the graphic data on the physical layout previously generated, or the data on the transferred image calculated in the OPC verifying processing. After that, a delay calculation processing portion built in the arrangement wiring system carries out delay calculation by using both the capacitance value and resistance value thus calculated.

As a result, when it is determined that it is necessary to carry out the repeater insertion because of occurrence of the timing error, the repeater insertion portions are extracted by referring to the information on the result of execution of the shape checking processing, the information on the lithography margin unachieved patterns, and the information on the connection in the circuit, and the repeater is inserted into each of the repeater insertion portions (Step S405). In the repeater insertion, the repeater is inserted between the wirings for which the element such as the buffer is divided into parts in the range of not violating a restriction of a floor plan about the arrangement wiring and the like.

The portion into which the repeater is to be inserted is the position indicated by the arrow in FIG. 3 similarly to the case of the first embodiment. In addition, the processing for carrying out layout verification for the physical layout after completion of the repeater insertion (Step S306) and it is confirmed that no lithography margin unachieved portion newly occurs. Here, the layout verifying processing (Step S306) can be omitted if being unnecessary. The case where it is unnecessary to execute the layout verifying processing is the case where it is possible to clearly determine that no lithography margin unachieved pattern newly occurs because of a slight change in layout.

Up to the processing described above is executed in the arrangement wiring tool. Subsequently, RC extracting processing (Step S307), delay calculating processing (Step S308), and static timing analyzing processing (Step S309) are executed. Since the repeater insertion is carried out in the processing executed in the arrangement wiring tool, no portion into which the repeater needs to be inserted occurs in and after that processing.

Note that, in the third embodiment, a delay calculation processing portion built in the arrangement wiring tool executes the timing error checking processing (Step S304) based on the delay calculation. However, it takes a lot of time to carry out that delay calculation, which may increase the entire processing time. In such a case, a relationship between each of the capacitance value and the resistance value, and the delay time is previously obtained, and a restriction about the capacitance value and the resistance value is produced. That is to say, when the arrangement wiring tool calculates the capacitance value and the resistance value from the graphic data after completion of the detailed wiring, either a design rule about the wiring width and the space width, or a rule about the capacitance value and the resistance value is put as data into the arrangement wiring tool. Also, the arrangement wiring tool reads out the rule in calculating the capacitance value and the resistance value, and outputs the data on the coordinates of the schematic portion to an arrangement wiring database. When this process is adopted, the shape checking processing has only to be executed, and thus it is unnecessary to execute the delay calculating processing in Step S304.

In the third embodiment as described above, the operation for inputting/outputting the data is saved, thereby making it possible to reduce the processing time because a lot of main processing is executed in the arrangement wiring tool.

It is noted that in the third embodiment, the conditions for the OPC processing and OPC verifying processing described above can be individually set depending on the semiconductor integrated circuit as an object of the manufacture. In addition, the shape checking processing may also depend on the analysis about the layout and the wafer image, the film thickness distribution or the like in addition to utilization of the design rule checking system. In addition, an example of the layout of the repeater insertion, used in the first embodiment is merely an example of a technical drawing of a circuit.

Moreover, although in the third embodiment, the repeater is selectively inserted into the portion having the long wiring length and the lithography margin unachieved pattern, the present invention is by no means limited to this condition. For example, as shown in FIG. 6, the insertion condition may also be set depending on the purpose so that the repeater is selectively inserted into a portion meeting the condition in which at least two conditions of the three conditions of the lithography margin unachieved pattern, the portion having the long wiring length, and the critical path overlap each other.

In addition, in the third embodiment, the example in which the portion having the long wiring length equal to or longer than the preset length is extracted from the graphic data on the physical layout of the semiconductor integrated circuit has been described as the shape checking processing. However, processing in which stepped portions of the wirings are detected from the cross sectional structure of the physical layout, the stepped portion of the wiring having the size equal to or larger than a preset value is extracted from these stepped portions of the wirings, and the stepped portion of the wiring thus extracted is made a candidate of the repeater insertion position may also be adopted as shape checking processing other than the shape checking processing described above.

Application Examples

The processing according to each of the first to third embodiments described above can be realized in the form of a program (a program for manufacturing a semiconductor device) which is executed in a computer. That is to say, the program is adapted to instruct the computer to execute the steps of: (a) acquiring the information on the graphic composing the physical layout of the semiconductor integrated circuit; (b) carrying out calculation for the transferred image in the physical layout, and calculating for the stepped portion in the wiring; (c) carrying out calculation for the signal delay based on the physical layout, and obtaining the wiring not meeting the specification having the signal delay previously set therein; and (d) setting the position into which the repeater is to be inserted based on the results obtained from the information on the graphic, the calculation for the transferred image, and the calculation for the stepped portion, respectively, with respect to the wiring not meeting the specification described above.

Of these steps (a) to (d), the step (a) corresponds to the schematic wiring (Steps S101, S201, and S301), and the detailed wiring (Steps S102, S202, and S302) which are shown in FIGS. 1, 4, and 5. The step (b) corresponds to the shape checking processing, the OPC processing, and the OPC verifying processing (Steps S104, S203, and S303) which are shown in FIGS. 1, 4 and 5. The step (c) corresponds to the delay calculating processing (Step S106, S204, and S304) which are shown in FIGS. 1, 4 and 5. Also, the step (d) corresponds to the repeater insertion made in consideration of the layout (Step S107, S205, and S305) which are shown in FIGS. 1, 4 and 5.

The steps composing the program for manufacturing a semiconductor device in this application example may either be prepared in the form of individual modules, or have a constitution in which a plurality of steps are incorporated in one module. For example, a design support program in the manufacture of the semiconductor device has either a structure in which the various tools such as the arrangement wiring tool (arrangement wiring system), the RC extracting tool (RC extracting system), and the delay calculating tool (delay calculating system) which are previously described are combined with one another, or a structure in which corresponding one(s) of the various tools is (are) read out as may be necessary. The module capable of utilizing these steps is stored in a storage section of a local computer, and is executed as may be necessary, or is stored in a server connected to a network, and is executed through an access to the server as may be necessary.

The processing containing therein these steps is executed in the form of a program by the computer, thereby making it possible to carry out the repeater insertion for the lithography margin as the feature of each of the first to third embodiments.

It is noted that the program including the processing according to each of the first to third embodiments is distributed in a state of being stored in a predetermined medium (such as a CD or a DVD), or is delivered through a network as well as is executed by the computer.

In addition, the present invention can also be realized in the form of a computer system (a system for manufacturing a semiconductor device) having a configuration which is favorable to execution of the program containing therein the processing according to each of the first to third embodiments described above. The system for manufacturing a semiconductor device according to another application example of the present invention includes hardware suitable for executing the various steps of the program according to each of the first to third embodiments. For example, the system for manufacturing a semiconductor device according to the another application example of the present invention is configured to include a display device and an I/O interface in addition to a CPU for speedily executing the various processing in the steps, a memory having a capacity enough to execute the processing, and a storage section for storing therein the various data.

The program for manufacturing a semiconductor device according to the another application example of the present invention is previously incorporated in the system for manufacturing a semiconductor device or is installed from the outside in the system for manufacturing a semiconductor device through a medium or a network, thereby making it possible to execute the processing as the features of the first to third embodiments described above.

In particular, the system for manufacturing a semiconductor device according to the another application example is configured in the form of a design support system in which the various tools such as the arrangement wiring tool (arrangement wiring system), the RC extracting tool (RC extracting tool), and the delay calculating tool (delay calculating system) are combined with one another as may be necessary. Thus, the system for manufacturing a semiconductor device has either a configuration in which these tools are individually incorporated so that the necessary tool(s) is (are) utilized case by case, or a configuration in which integrated software causing an access to the individual tools to be readily made is incorporated so that the various tools are read out through an interface for the integrated software.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device, comprising the steps of:
   acquiring information on a graphic composing a physical layout of a semiconductor integrated circuit;
   extracting a step portion of the physical layout having a wiring dimension equal to or larger than a preset value;
   calculating, with a computer system, a signal delay based on the physical layout, and determining whether a wiring not meeting a signal delay threshold set forth in a specification exists; and
   if a wiring not meeting the signal delay threshold exists, then setting, with the computer system, an insertion position in which a repeater is to be inserted in the physical layout based on results obtained from the information on the graphic, and the extracted step portion in response to a result of the signal delay calculation.

2. A method of manufacturing a semiconductor device, comprising the steps of:
   acquiring information on a graphic composing a physical layout of a semiconductor integrated circuit;
   extracting a step portion of the physical layout having a wiring dimension equal to or larger than a preset value;
   calculating, with a computer system, a signal delay based on the physical layout, and determining whether a wiring not meeting a signal delay threshold set forth in a specification exists; and
   sending information on the wiring not meeting the specification to an arrangement wiring system, and setting, with the computer system, an insertion position in which a repeater is to be inserted in the physical layout based on the information on the wiring not meeting the specification in the arrangement wiring system and the extracted step portion.

3. A non-transitory computer readable storage medium having stored thereon a program for manufacturing a semiconductor device, the program being executable by a computer to perform the steps of:
   acquiring information on a graphic composing a physical layout of a semiconductor integrated circuit;
   extracting a step portion of the physical layout having a wiring dimension equal to or larger than a preset value;
   calculating a signal delay based on the physical layout, and determining whether a wiring not meeting a signal delay threshold set forth in a specification exists; and
   if a wiring not meeting the signal delay threshold exists, then setting an insertion position in which a repeater is to be inserted in the physical layout based on results obtained from the information on the graphic, and the extracted step portion, respectively.

4. A non-transitory computer readable storage medium having stored thereon a program for manufacturing a semiconductor device, the program being executable by a computer to perform the steps of:
   acquiring information on a graphic composing a physical layout of a semiconductor integrated circuit;
   extracting a step portion of the physical layout having a wiring dimension equal to or larger than a preset value;
   calculating a signal delay based on the physical layout, and determining whether a wiring not meeting a signal delay threshold set forth in a specification exists; and
   if a wiring not meeting the signal delay threshold exists, then sending information on the wiring not meeting the specification to an arrangement wiring system, and setting an insertion position into which a repeater is to be inserted in the physical layout based on results obtained from the information on the graphic, and the extracted step portion in response to the wiring not meeting the specification in the arrangement wiring system.

5. A system for manufacturing a semiconductor device, the system including a computer to execute the steps of:
   acquiring information on a graphic composing a physical layout of a semiconductor integrated circuit;
   extracting a step portion of the physical layout having a wiring dimension equal to or larger than a preset value;
   calculating a signal delay based on the physical layout, and determining whether a wiring not meeting a signal delay threshold set forth in a specification exists; and
   if a wiring not meeting the signal delay threshold exists, then setting an insertion position into which a repeater is to be inserted in the physical layout based on results obtained from the information on the graphic, and the extracted step portion.

6. A system for manufacturing a semiconductor device, the system including a computer to execute the steps of:

acquiring information on a graphic composing a physical layout of a semiconductor integrated circuit;

extracting a step portion of the physical layout having a wiring dimension equal to or larger than a preset value;

calculating a signal delay based on the physical layout, and determining whether a wiring not meeting a signal delay threshold set forth in a specification exists; and if a wiring not meeting the signal delay threshold exists, then sending information on the wiring not meeting the specification to an arrangement wiring system, and setting an insertion position in which a repeater is to be inserted in the physical layout based on results obtained from the information on the graphic, and the extracted step portion, respectively, in response to the wiring not meeting the specification in the arrangement wiring system.

* * * * *